United States Patent
Aipperspach et al.

(10) Patent No.: US 6,570,433 B2
(45) Date of Patent: May 27, 2003

(54) LASER FUSEBLOW PROTECTION METHOD FOR SILICON ON INSULATOR (SOI) TRANSISTORS

(75) Inventors: Anthony Gus Aipperspach, Rochester, MN (US); Todd Alan Christensen, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/925,918

(22) Filed: Aug. 9, 2001

(65) Prior Publication Data

US 2002/0027248 A1 Mar. 7, 2002

Related U.S. Application Data

(62) Division of application No. 09/588,247, filed on Jun. 6, 2000, now Pat. No. 6,509,236.

(51) Int. Cl.$^7$ ............................................. H01H 85/00
(52) U.S. Cl. ........................................ 327/525; 327/526
(58) Field of Search ................................. 327/525, 526; 361/56, 91

(56) References Cited

U.S. PATENT DOCUMENTS 5,986,862 A * 11/1999 Kim ............................. 361/56
6,262,919 B1 * 7/2001 Chou ........................... 327/525

* cited by examiner

*Primary Examiner*—Kenneth B. Wells
(74) *Attorney, Agent, or Firm*—Joan Pennington

(57) ABSTRACT

A method and apparatus are provided for laser fuseblow protection in transistors, such as silicon-on-insulator (SOI) transistors. The transistors are connected to a fuse. A pair of diodes are connected in series between a high supply and ground. A common connection of the series connected pair of diodes is connected to a common connection of the fuse and transistors. A charge is shunted to the high supply or ground by the pair of diodes with a first voltage a set value above the high supply and a second voltage a set value below the ground. A pair of protection diodes are provided on each side of the fuse with transistors. The transistors are either connected to one side of the fuse or to both sides of the fuse.

2 Claims, 3 Drawing Sheets

LASER FUSEBLOW PROTECTION METHOD FOR SILICON ON INSULATOR (SOI) TRANSISTORS

This application is a divisional application of Ser. No. 09/588,247 filed on Jun. 6, 2000, now U.S. Pat. No. 6,509,236.

FIELD OF THE INVENTION

The present invention relates to a method and apparatus for laser fuseblow protection in silicon-on-insulator (SOI) transistors.

DESCRIPTION OF THE RELATED ART

Silicon-on-insulator (SOI) technology is an enhanced silicon technology currently being utilized to increase the performance of digital logic circuits. Utilizing SOI technology designers can increase the speed of digital logic integrated circuits while reducing their overall power consumption. These advances in technology will lead to the development of more complex and faster computer integrated circuits that operate with less power.

As shown in FIG. 1, SOI semiconductors include a thin layer of silicon placed on top of an insulator, such as silicon dioxide ($SiO_2$) or glass, and a MOS transistor built on top of this structure. The SOI FET includes a body (B), a gate (G), a drain (D) and a source (S). The main advantage of constructing the MOS transistor on top of an insulator layer is to reduce the internal capacitance of the transistor. This is accomplished by placing the insulator oxide layer between the silicon substrate and the impurities required for the device to operate as a transistor. Reducing the internal capacitance of the transistor increases its operating speed. With SOI technology faster MOS transistors can be manufactured resulting in higher performance semiconductors for faster electronic devices.

In a conventional, bulk silicon process, the transistors are built in the top surface of a relatively thick mass of silicon. During a laser fuseblow process, energy that is imparted to the transistors has this thick silicon in which to dissipate this energy. SOI transistors are built on the thin layer of silicon placed on top of a thicker insulator as shown in FIG. 1. Damage to the SOI transistor devices can occur due to the decreased ability to dissipate the resulting charge build up form the laser fuseblow process in the thin layer of silicon.

A need exists for a mechanism for protecting SOI transistors from an excess voltage and charge that can be built up during a laser fuseblow process.

SUMMARY OF THE INVENTION

A principal object of the present invention is to provide a method and apparatus for laser fuseblow protection in silicon-on-insulator (SOI) transistors. Other important objects of the present invention are to provide such a method and apparatus for laser fuseblow protection in silicon-on-insulator (SOI) transistors substantially without negative effect and that overcome many of the disadvantages of prior art arrangements.

In brief, a method and apparatus are provided for laser fuseblow protection in transistors, such as silicon-on-insulator (SOI) transistors. The transistors are connected to a fuse. A pair of diodes are connected in series between a high supply and ground. A common connection of the series connected pair of diodes is connected to a common connection of the fuse and transistors. A charge is shunted to the high supply or ground by the pair of diodes with a first voltage a set value above the high supply and a second voltage a set value below the ground.

In accordance with features of the invention, a pair of protection diodes are provided on each side of the fuse with transistors. The transistors are either connected to one side of the fuse or to both sides of the fuse.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 2:
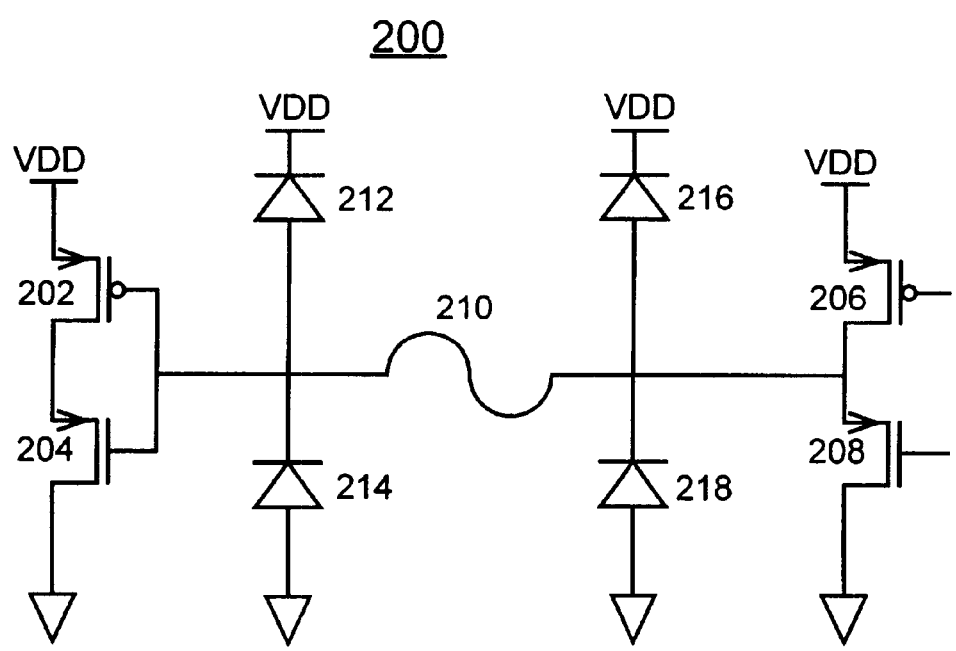
FIG. 2 is a schematic diagram illustrating apparatus for laser fuseblow protection in silicon-on-insulator (SOI) transistors in accordance with the preferred embodiment.

Having reference now to the drawings, in FIG. 2, there is shown apparatus for laser fuseblow protection in silicon-on-insulator (SOI) transistors of the preferred embodiment generally designated by the reference character 200. As shown in FIG. 2, a plurality of SOI transistors 202, 204, 206 and 208 are directly connected to a fuse 210. It should be understood that the principles of the present invention are not limited to silicon-on-insulator (SOI) transistors and can be used with other types of transistors, such as conventional, bulk silicon transistor devices.

In very large scale integrated (VLSI) chips, it is common to have fuses, such as fuse 210 that can be programmed for various reasons. Among these reasons include invoking redundant elements in memory arrays for repairing failing locations or programming identification information. A common method of building and programming such fuses 210 is to build a thin metal wire fuse near the top surface of the chip. The fuse 210 can be programmed by selectively deleting the thin metal using a laser (not shown). The thin wire is connected to a circuit that can sense whether the fuse remains or has been deleted. The laser imparts energy that vaporizes the metal to create an open circuit. The circuit that senses the presence or absence of a fuse 210 must be able to withstand the energy of the laser fuseblow process.

In accordance with features of the preferred embodiment, the problem of protecting the SOI transistors 202, 204, 206 and 208 connected to fuse 210 to withstand the energy of the laser fuseblow process is solved by a plurality of protection diodes 212, 214, 216 and 218. Protection diodes 212, 214, 216 and 218 of the preferred embodiment are designed for protecting the SOI transistors 202, 204, 206 and 208 directly connected to fuse 210.

Figure 1:
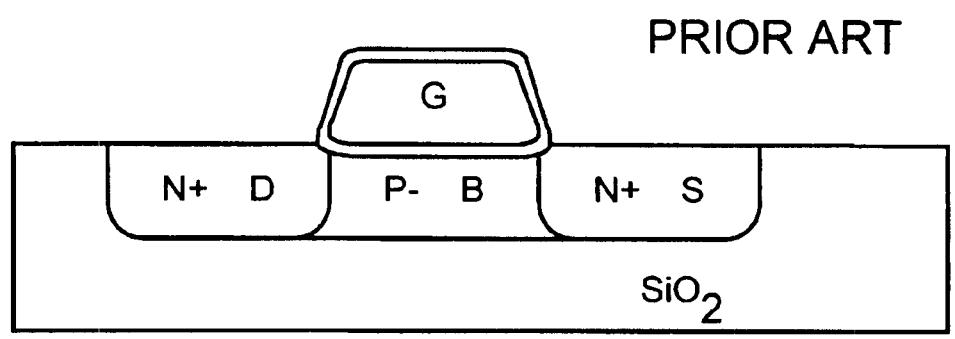
FIG. 1 is a cross sectional view illustrating a conventional silicon-on-insulator (SOI) N-channel field effect transistor (NFET)

There are many designs or arrangements for sensing whether a fuse 210 has been blown or not. In all cases transistors are directly connected to fuse 210 either on one side or both sides of the fuse and are prone to damage. In FIG. 1, the SOI transistors 202, 204, 206 and 208 directly connected to fuse 210 are protected respectively by protection diodes 212, 214, 216 and 218. Protection diodes 212 and 214 and protection diodes 216 and 218 are connected in series between the high supply VDD and ground. As shown in FIG. 2, a cathode of diodes 212, 216 is connected to the high supply and an anode of diodes 212, 216 is connected respectively to a cathode of diodes 214, 218 with an anode of diodes 214, 218 connected to ground. A common connection of the series connected protection diodes 212 and 214 is connected to the common connection of fuse 210 and SOI transistors 202 and 204. A common connection of the series connected protection diodes 216 and 218 is connected to the common connection of fuse 210 and SOI transistors 206 and 208.

By designing the protection diodes 212, 214, 216 and 218 to each power supply on each side of the fuse 210 with transistors 202 and 204, and transistors 206 and 208, the transistors 202, 204, 206 and 208 are protected from the otherwise destructive voltages that could damage them. The protection diodes 212, 214, 216 and 218 will shunt the charge to either the ground or high supply if the voltage rises above a diode threshold voltage or around 0.7 Volt above the high supply or drops lower than 0.7 Volt below the ground supply. Transistors are typically designed to withstand these voltages that are only 0.7 Volt above or below typical or expected values during functional operation.

Figure 3:
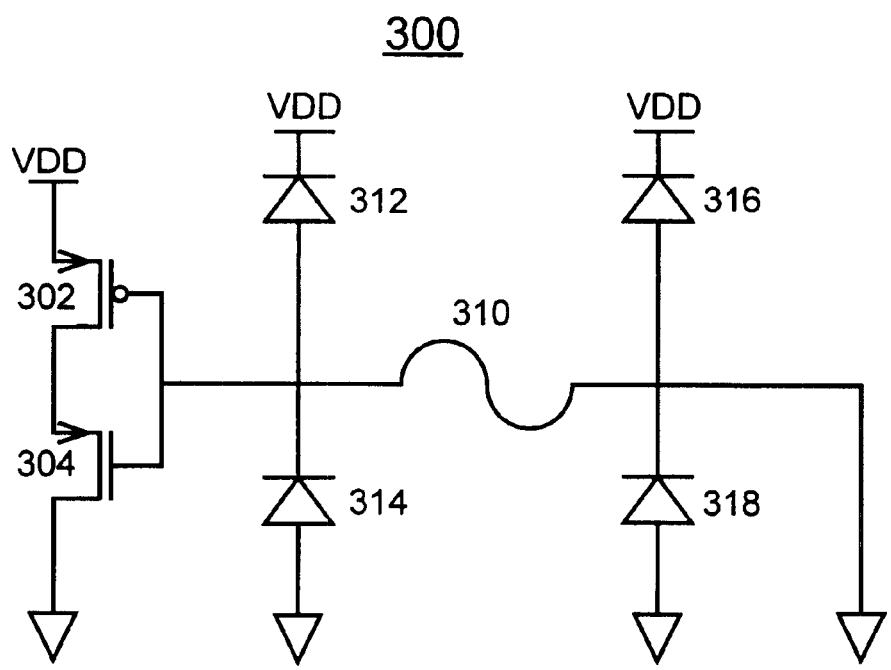
FIG. 3 is a schematic diagram illustrating another apparatus for laser fuseblow protection in silicon-on-insulator (SOI) transistors in accordance with the preferred embodiment.

Referring to FIG. 3, there is shown another apparatus for laser fuseblow protection in silicon-on-insulator (SOI) transistors of the preferred embodiment generally designated by the reference character 300. As shown in FIG. 3, a pair of SOI transistors 302, 304 are directly connected to one side of a fuse 310. The other side of fuse 310 is connected to ground. Protecting the SOI transistors 302 and 304 connected to fuse 310 to withstand the energy of the laser fuseblow process is solved by a plurality of protection diodes 312, 314, 316 and 318. Protection diodes 312 and 314 and protection diodes 316 and 318 are connected in series between the high supply VDD and ground. As shown in FIG. 3, a cathode of diodes 312, 316 is connected to the high supply and an anode of diodes 312, 316 is connected respectively to a cathode of diodes 314, 318 with an anode of diodes 314, 318 connected to ground. A common connection of the series connected protection diodes 312 and 314 is connected to the common connection of fuse 310 and SOI transistors 302 and 304. A common connection of the series connected protection diodes 316 and 318 is connected to the common connection of fuse 310 and ground.

By designing the protection diodes 312, 314, 316 and 318 to each power supply on each side of the fuse 310 with transistors 302 and 304, the transistors 302 and 304 are protected from the otherwise destructive voltages that could damage them. The protection diodes 312, 314, 316 and 318 will shunt the charge to either the ground or high supply if the voltage rises above a diode threshold voltage or around 0.7 Volt above the high supply or drops lower than 0.7 Volt below the ground supply.

While the present invention has been described with reference to the details of the embodiments of the invention shown in the drawing, these details are not intended to limit the scope of the invention as claimed in the appended claims.

What is claimed is:

1. Apparatus for laser fuseblow protection in transistors connected to a fuse comprising:

a pair of diodes connected in series between a high supply and ground;

a common connection of said series connected pair of diodes connected to a connection of the fuse and the transistors;

said pair of diodes shunting a charge to said high supply or ground with a first voltage a set value above said high supply and a second voltage a set value below said ground;

one side of the fuse being connected to ground; and a second pair of diodes connected in series between a high supply and ground; and a common connection of said series connected second pair of diodes connected to a connection of the fuse and ground.

2. Apparatus for laser fuseblow protection in transistors connected to a fuse comprising:

a pair of diodes connected in series between a high supply and ground;

a common connection of said series connected pair of diodes connected to a connection of the fuse and the transistors;

said pair of diodes shunting a charge to said high supply or ground with a first voltage a set value above said high supply and a second voltage a set value below said ground; and the transistors are fuse sense transistors for sensing the presence or absence of the fuse.

* * * * *